United States Patent [19]

Asai et al.

[11] Patent Number: 4,515,507

[45] Date of Patent: May 7, 1985

[54] METHOD AND APPARATUS FOR HOLDING AND CENTERING ELECTRONIC COMPONENT

[75] Inventors: Koichi Asai, Nagoya; Mamoru Tsuda, Okazaki; Kunio Oe; Yasuo Muto, both of Chiryu, all of Japan

[73] Assignee: Fuji Machine Mfg. Co., Ltd., Japan

[21] Appl. No.: 525,392

[22] Filed: Aug. 22, 1983

[30] Foreign Application Priority Data

Jun. 1, 1983 [JP] Japan ................................. 58-97363

[51] Int. Cl.³ ..................... B65G 47/91; H05K 13/02
[52] U.S. Cl. ..................................... 414/226; 29/740; 29/743; 29/759; 294/2; 294/116; 294/64.1; 414/744 B
[58] Field of Search ............... 294/2, 64 R, 86 R, 116; 29/739–743, 759; 269/153, 155; 414/120, 121, 226, 627, 737, 744 B, 752, 753

[56] References Cited

U.S. PATENT DOCUMENTS

| | | | |
|---|---|---|---|
| 4,135,630 | 1/1979 | Snyder et al. | 294/64 R X |
| 4,290,732 | 9/1981 | Taki et al. | 414/752 |
| 4,327,482 | 5/1982 | Araki et al. | 29/740 |
| 4,381,601 | 5/1983 | Tamai et al. | 414/226 X |
| 4,438,559 | 3/1984 | Asai et al. | 29/740 |
| 4,473,247 | 9/1984 | Itemadani et al. | 294/2 |

FOREIGN PATENT DOCUMENTS 55-37283  3/1980  Japan .
58-53887  3/1983  Japan .

*Primary Examiner*—Johnny D. Cherry
*Attorney, Agent, or Firm*—Parkhurst & Oliff

[57] ABSTRACT

Method and apparatus for holding an electronic component prior to its placement on a circuit substrate. The component sucked by a sucker is first centered in one direction by closing movements of a first pair of opposed positioning members toward the component, and then centered in another direction normal to the above one direction by closing movements of a second pair of opposed positioning members which occur only after the first pair of positioning members are opened. The first pair of positioning members are provided on an assembly holding the sucker, and the second pair of positioning members are provided on the sucker holder assembly or separately from the sucker holder assembly. In the latter instance, the assembly holding the sucker and the first pair of positioning members are adapted to be movable relative to the separately provided second pair for alignment of the sucker with the separate second pair.

20 Claims, 16 Drawing Figures

METHOD AND APPARATUS FOR HOLDING AND CENTERING ELECTRONIC COMPONENT

BACKGROUND OF THE INVENTION

The present invention relates to a method for holding and precisely centering an electronic component for the purpose of and prior to the placement of the component on a circuit substrate or the like, and to an apparatus suitable for practicing the method.

It is known to hold an electronic component by using a sucking device which has an air sucking passage open at an end face thereof. Such sucking device is capable of easily retaining and releasing the component, but has no capability of accurately positioning the component by itself. For this reason, it has been a common practice to employ positioning or centering means for correcting the position of the component which has been sucked on the sucking device. An example of such centering devices is disclosed in U.S. PAT. NO. 4,135,630, wherein a spindle housing which supports a sucker spindle longitudinally movably carries a pair of opposed first axis locators and a pair of opposed second axis locators which are pivoted such that the ends (positioning fingers) of the locators are opened and closed along the first and second (X and Y) axes which are perpendicular to each other. The electronic component held under vacuum on the tip of the sucker spindle is centered by the closed ends of the locators by holding the component on four sides thereof in a sandwiched fashion in both first and second directions normal to each other. The opposed positioning fingers at the ends of the locators are adapted to move in symmetrical relation with each other with respect to the centerline of the sucker spindle, and consequently the centering of the component into alignment with the spindle centerline is achieved through the symmetrical or concentric inward movements of the positioning fingers toward the component. Another example is shown in Japanese Patent Application laid open Mar. 30, 1983 under TOKU-KAI-SHO No. 58-53887. In a holding and positioning apparatus disclosed in this Application, a holder body which supports a sucker for longitudinal sliding movement is provided with a single pair of opposed positioning jaws which are pivotable to align a sucked component in one direction. The component is then aligned in another direction perpendicular to said one direction by means of another pair of opposed positioning members disposed on a positioning device which is separate from the sucker assembly. Like the positioning fingers of the opposed locators shown in the above indicated U.S. Patent, the positioning jaws or members are moved in symmetrical relation with each other with respect to the centerline of the sucker, and therefore the component is pushed into alignment with the center of the sucker.

Holding and centering devices as discussed above are capable of holding an electronic component on a sucker in precise alignment with a predetermined reference position. Thus, an accurate positioning of the sucker with respect to, for example, a printed-circuit board (PCB) substrate, will enable the component held on the sucker to be precisely orientated or positioned relative to the substrate and placed at required positions on the substrate with accordingly high accuracy.

However, the holding and centering device of the type discussed suffers a problem which arises from the arrangement that the positioning of the sucked component in the second direction is effected while the component is gripped by the first pair of positioning members (jaws or fingers) which have positioned the component in the first direction normal to the second direction. In other words, the second pair of positioning members are operated to push the gripped component for aligning the component in the second direction. Under this condition, a smooth movement of the component in the second direction by the second pair of positioning members is prevented by a friction force between the component and the first pair of positioning members. Alternatively, an absence of a frictional sliding movement between the component and the first pair of positioning members would result in the component being moved in the second direction together with the first pair of positioning members while the latter are subjected to elastic deformation. Upon release of the second positioning members from the component which has been positioned in the second direction, the component tends to move in the second direction toward its original, unaligned position due to elasticity or spring force of the deformed first positioning members. Thus, the prior holding and centering apparatus is disadvantageous and not completely satisfactory in its positioning or centering accuracy.

It is further recognized that the possible sliding movement of the component in frictional contact with the first pair of positioning members in the second direction will cause the component to be scratched or scored on its sides. As another drawback, the frictional sliding of the component which generally uses ceramic material for its base will also cause easy wearing of the positioning surface of the positioning members and necessitate frequent changes of the worn-out positioning members.

SUMMARY OF THE INVENTION

It is accordingly an object of the present invention to provide a method and an apparatus for holding an electronic component and precisely centering the component with smooth movements thereof without frictional sliding on positioning or centering members or elastic deformation of the latter.

It is another object of the invention to provide such method and apparatus which eliminate a possibility of scratching the side surfaces of the component, and which assure prolonged service life of the positioning members.

A method for holding and centering an electronic component according to the present invention is characterized in that the method comprises: (a) holding an electronic component through suction on a sucker having an air sucking passage open at an end face thereof; (b) moving a first pair of positioning members toward each other in a first direction substantially normal to a longitudinal centerline of said sucker, in symmetrical relation with each other with respect to said centerline, so as to hold said electronic component sucked by said sucker, on opposite sides thereof, and thereby pushing said electronic component into alignment with said centerline of said sucker in said first direction while moving the electronic component along said end face; (c) moving said first pair of positioning members away from said electronic component after the component has been centered in said first direction; and (d) moving a second pair of positioning members toward each other in a second direction substantially normal to said centerline of the sucker and said first direction, in symmetrical relation with each other with respect to said centerline, so as to hold said electronic component on the other opposite sides thereof, and thereby pushing said electronic component into alignment with said centerline of the sucker in said second direction.

One embodiment of an apparatus suitable for carrying out the above method according to the invention comprises a holder assembly including a sucker; sucker drive means; a first positioning unit; a second positioning unit; and positioning drive means for actuating the first and second positioning units. The sucker has an air sucking passage open at an end face thereof for holding through suction an electronic component on the end face, and is supported in engagement with a holder body of the holder assembly for longitudinal movement relative to the same. The sucker is movable by the sucker drive means along a longitudinal centerline thereof between an advanced position at which the electronic component is sucked by the sucker, and a retracted position which is distant from the advanced position toward the holder body along the centerline. The holder body which cooperates with the sucker to constitute the holder assembly, carries the first positioning unit which includes a first pair of positioning members supported by the holder body and movable from spaced-apart positions thereof toward each other in a first direction substantially normal to the centerline of the sucker, in symmetrical relation with each other with respect to the centerline of the sucker, so as to hold the electronic component on opposite sides thereof while the component is sucked by the sucker at the retracted position, thereby pushing the electronic component into alignment with the centerline of the sucker in the first direction. On the other hand, the second positioning unit is provided separately from the holder assembly. A support body of the second positioning unit, and the holder body are movable relative to each other for temporary alignment with each other. The support body supports a second pair of positioning members which are movable, upon the temporary alignment of the holder body with the support body, from spaced-apart positions thereof toward each other in a second direction substantially normal to the centerline of the sucker and the first direction, in symmetrical relation with each other with respect to the sucker centerline, so as to hold the electronic component on the other opposite sides thereof and thereby push the electronic component into alignment with the centerline of the sucker in the second direction. The positioning drive means for actuating the above first and second positioning units is arranged to move the first pair of positioning members toward each other at one timing while the sucker is placed in the retracted position, and move the second pair of positioning members toward each other at another timing while the temporary alignment is established between the holder body and the support body. The above movements of the first and second positioning members are effected at least once at said different timings. However, the positioning drive means is adapted such that each one of the first and second pairs of positioning members are actuated while the other pair of positioning members are held in the spaced-apart position so that the first and second pairs will not simultaneously contact the component.

A second embodiment of an apparatus according to the invention comprises, as in the first embodiment, a first pair of positioning members and a second pair of positioning members. However, the first and second pairs of positioning members of the second embodiment are both carried by a holder body which supports a sucker. More specifically, the first and second pairs of positioning members are movable respectively in a first and a second direction substantially normal to the centerline of the sucker, the first and second directions being normal to each other. The positioning members in each of the two pairs are movable from spaced-apart positions thereof toward each other in respective one of the first and second directions in symmetrical relation with each other with respect to the sucker centerline so as to hold the electronic component on opposite sides thereof while the component is sucked by the sucker at the retracted position, thereby centering the electronic component into alignment with the centerline of the sucker in the first and second directions. These two pairs of positioning members are actuated, for centering the electronic component in the two direction, by positioning drive means such that the electronic component is held on opposite sides thereof sequentially by the first and second pairs of positioning members, i.e., in such manner that the two pairs will not simultaneously contact the component, as in the first embodiment.

As described heretofore, the electronic component sucked on the sucker is centered into alignment with the sucker by first moving the first pair of positioning members toward each other in the first direction to push and hold the component into position, then moving the first pair of positioning members away from the electronic component, and moving the second pair of positioning members toward each other in the second direction to hold the component in place. This manner of centering will avoid the otherwise possible tendency, as experienced in the art, of the first pair of positioning members of preventing the centering of the component in the second direction, and thus assure maintenance of sufficiently high consistent positioning accuracy. Further, there will be no frictional sliding of the component between the first pair of positioning members upon centering of the component in the second direction, whereby the component will not be scratched and the positioning surfaces of the first positioning members will not be worn out in a short time. In spite of a concern about the possibility that the component which has once been centered in the first direction by the first positioning members would be moved out of position in the first direction upon centering of the component in the second direction by the second positioning members, there is in fact substantially no such possibility of disclocation or shifting of the component and a sufficiently high accuracy is obtained in positioning the component into alignment with the centerline of the sucker.

The previously indicated two embodiments of the apparatus according to the invention are constructed to suitably practice the method of the invention. In the first embodiment, one of the two pairs of positioning members are provided on the component holder assembly (component placing head) while the other pair of positioning members are provided independently of or separately from the holder assembly. This arrangement will simplify the holder assembly and the adjacent related parts and advantageously contributes to reduction in size of the component placing head. This advantage is prominent particularly when the apparatus is used with a component placing device which has a number of holder assemblies (component placing heads). A further advantage is produced where the sucker assembly carrying an electronic component is moved intermittently while stopping at plural work stations. In this instance, the centering of the component in the first direction is achieved at one work station, and the centering in the second direction is effected at another work station, whereby the centering in both directions may be achieved simultaneously at two different stations with a result of reducing a stop time of each holder assembly at one station and consequently improving an efficiency of producing a printed circuit board loaded with various electronic components.

In comparison with the first embodiment, the second embodiment of the apparatus wherein the holder body of the component holder assembly carries both first and second pairs of positioning members, is suitable for a component placing device that has a relatively few sucker assemblies or for a device whose sucker assemblies are not intermittently positioned at plural work stations, e.g., suitable for a device wherein each holder assembly or placing head is moved relative to a fixed circuit substrate and located at predetermined positions on the substrate to place electronic components at those positions.

BRIEF DESCRIPTION OF THE DRAWINGS

The above and other objects, features and advantages of the present invention will become more apparent from reading the following description of the preferred embodiments taken in connection with the accompanying drawings in which.

DETAILED DESCRIPTION OF THE PREFERRED EMBODIMENT

Figure 1:
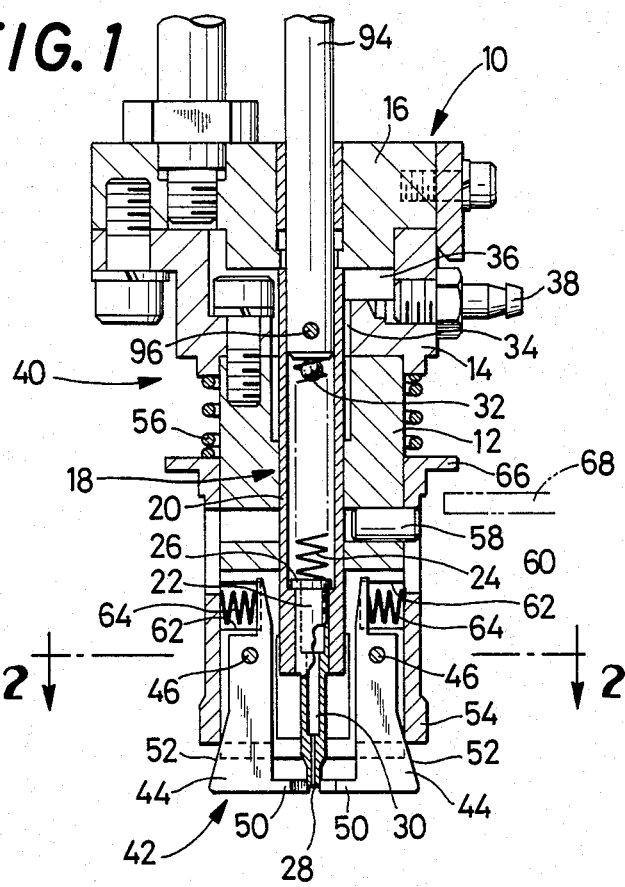
FIG. 1 is a front elevation in cross section of a component holder assembly and a first pair of positioning members of a first embodiment of an apparatus for holding and centering an electronic component according to the present invention.

First Embodiment:

Referring first to FIGS. 1-10, a first embodiment of the present invention will be described below:

There is shown in FIG. 1 a holder body 10 which, for convenience of manufacture, consists of three separate members; a first member 12, a second member 14 and a third member 16. The first and second members 12 and 14 have axially central portions defining axial through-holes in which a sucker 18 is fitted slidably axially thereof. This sucker 18 consists of a first member 20 and a second member 22. The first member 20 has a stepped through-bore formed of a large diameter hole, and a small diameter hole in which the second member is slidably fitted. The second member 22 is biased by a spring 24 in the direction that causes the member 22 to protrude out of the first member 20. The second member includes a head 26 which is abuttable on a shoulder surface on the first member 20 so as to limit a distance of protrusion of the second member, more particularly an amount of protrusion of a small-diameter tip of the second member 22 which is axially opposite to the head 26. The second member 22 has an air sucking passage 30 extending axially thereof and open at the center of an end face 28 of the said tip. The air passage 30 is connected to a vacuum source or tank (not shown) through the hole in the first member 20, a communication hole 32 formed in the first member, an annular passage 34 defined between the holder body 10 and the sucker 18, a chamber 36 formed in the holder body 10, and a joint fitting 38. As described above, the holder body 10 and the sucker 18 constitutes a major portion of a holder assembly 40.

Figure 2:
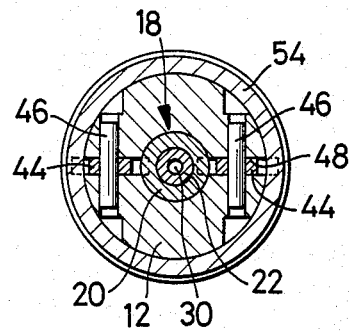
FIG. 2 is a cross section taken along line 2—2 of FIG. 1.
Figure 3:
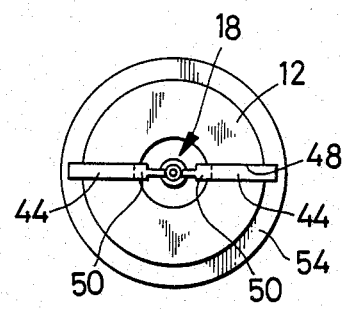
FIG. 3 is a bottom view of the apparatus shown in FIG. 1.

The holder assembly 40 carries a first positioning unit 42 which includes a pair of opposed jaws 44 of generally planar configuration designed as pivotable means. The jaws 44 are attached by respective pins 46 to the first member 12 of the holder body 10. Put in more detail, the first member 12 which is a cylindrical member is provided at its end portion with slots 48 which are formed in line diametrically of the cylinder 12, as shown in FIG. 2. These slots 48 receive the opposed jaws 44 such that the jaws 44 are supported at their intermediate portions by the pins 46 pivotably about the same and their lower portions are located out of the second member 12. The lower portions of the opposed jaws 44 have opposed inward protrusions 50 radially extending toward the centerline of the sucker 18. Each of the inward protrusions 50 has a tip whose width is smaller than a diameter of the small-diameter tip of the sucker 18, as shown in FIG. 3. The opposed jaws 44 have outer cam surfaces 52 which are tapered symmetrically with each other with respect to the centerline of the sucker 18 such that the opposite cam surfaces 52 diverge from the sucker centerline as viewed in the direction from the pins 46 toward the lower ends of the jaws 44. These tapered cam surfaces 52 engage an inner annular edge of the lower open end of a sleeve 54 which engages the outer surface of the first member 12. The sleeve 54 is axially biased by a spring 56 toward the lower end of the first member 12, but the axial movement of the sleeve 54 is limited by a pin 58 which extends from the first member 12 into an elongated hole 60 formed in the sleeve 54, i.e., by abutting contact of the pin 58 with the wall of the sleeve 54 defining the ends of the elongate hole 60. The opposed jaws 44 are biased by springs 64 each of which is disposed between the inner surface of the sleeve 54 and the upper end portion of the jaw 44. In other words, the springs 64 which are accommodated in blind holes 62 in the first member 12 act on the jaws 44 at their ends opposite to the inward protrusions 50, so that the jaws 44 are pivoted in the direction that causes their lower ends to open, i.e., the opposed inward protrusions 50 to move away from each other toward their spaced-apart positions. However, the pivotal movements of the jaws 44 are blocked through the engagement of the tapered cam surfaces 52 with the sleeve 54 as stated above. The sleeve 54 has at its upper end a flange 66 which is engageable with an engaging member 68. With this arrangement, an axial upward retracting movement of the sleeve 54 by the engaging member 68 against a resilient force of the spring 56 will permit the opposed jaws 44 to open, while an axial downward advancing movement of the same will cause the jaws 44 to close. The symmetry of the tapered cam surfaces 52 of the jaws with respect to the centerline of the sucker 18, enables the opposed inward protrusions 50 to move toward and away from each other in a direction substantially normal to the centerline of the sucker 18 while the protrusions 50 maintain a symmetrical relation with each other with respect to the sucker centerline. The first positioning unit 42 of the present first embodiment is constructed as hereinbefore described, and the opposed inward protrusions 50 serve as a first pair of positioning members.

Figure 4:
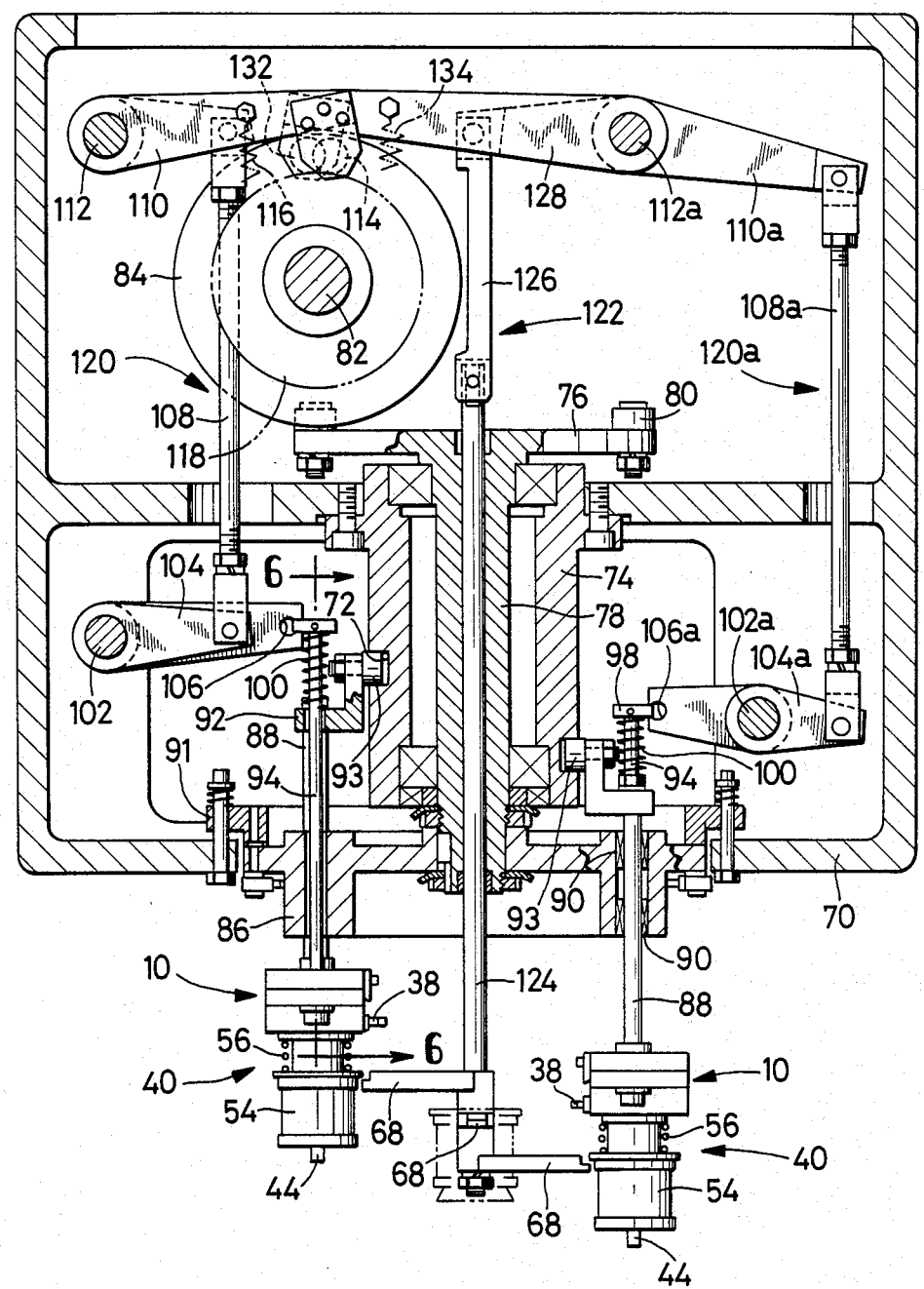
FIG. 4 is a fragmentary side elevational view in cross section showing an essential part of a device which has a plurality of such component holder assemblies as shown in FIGS. 1-3 for placing electronic components on a circuit substrate.
Figure 5:
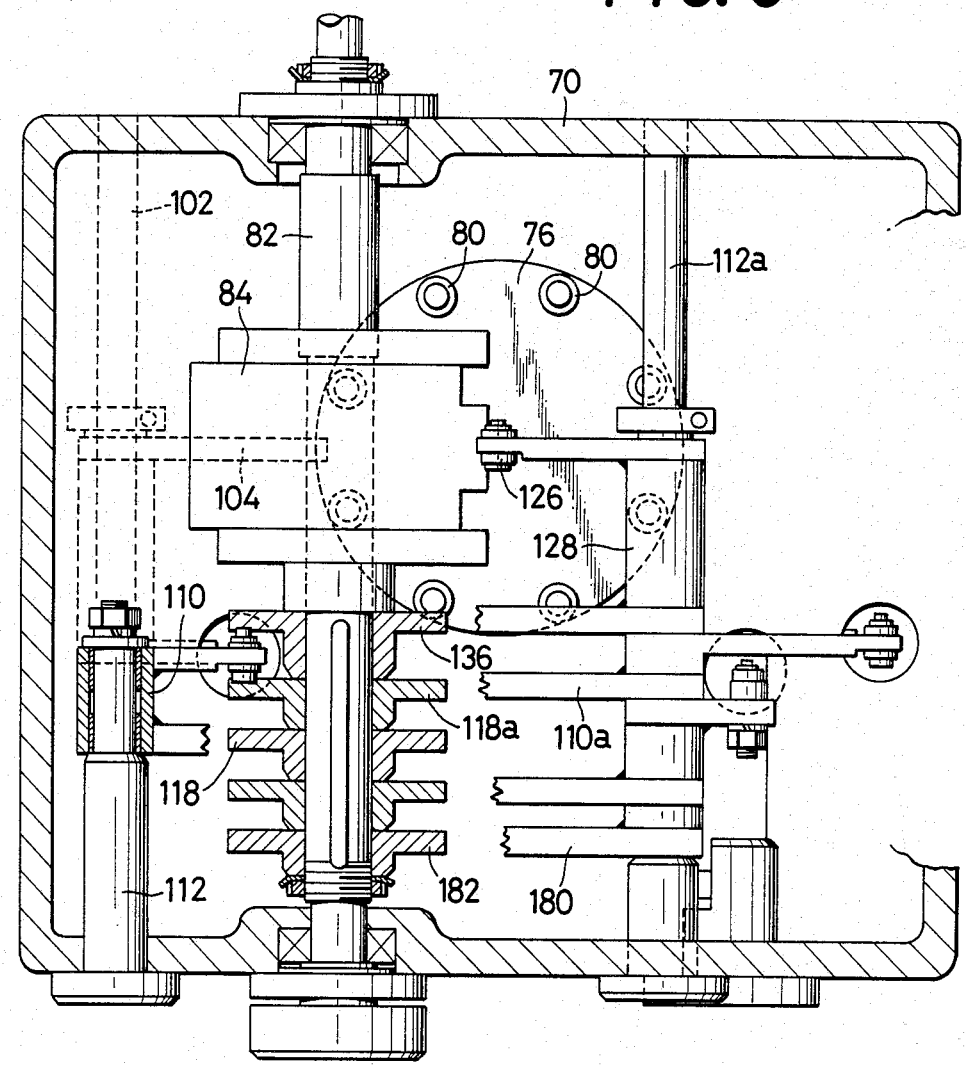
FIG. 5 is a cross sectional plan view of the device of FIG. 4.
Figure 6:
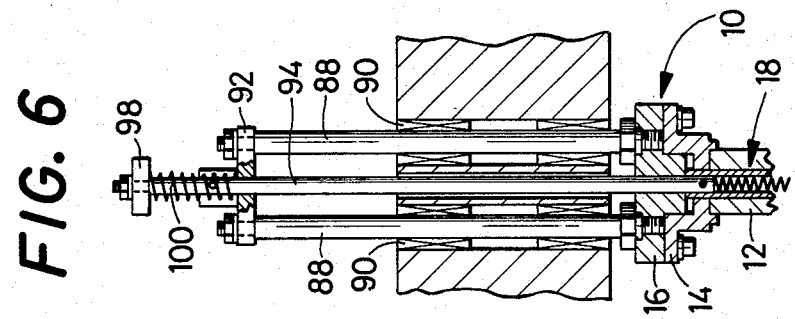
FIG. 6 is a cross section taken along line 6—6 of FIG. 4.

The above holder assembly 40 and the first positioning unit 42 are mounted on a component placing device of FIGS. 4 and 5 which is designed to place or mount, at predetermined positions on a circuit substrate, electronic components in the form of chips having no leads. The device has a main frame 70 to which is fixed a solid cam 74 having a cam groove 72 in its outer cylindrical surface. The solid cam 74 rotatably supports a hollow rotary shaft 78 through bearings, and the rotary shaft 78 includes at its upper end a disc portion 76 which carries eight rollers 80 equiangularly spaced from one another along its periphery. These rollers 80 are engageable with a cam groove formed in an indexing cam 84 which is fixed to a drive shaft 82. When the drive shaft 82 is rotated at a constant speed, the rotary shaft 78 is rotated intermittently by one eighth revolution per revolution of the rotary shaft 78. To the lower end of the rotary shaft 78, there is attached a rotary disc 86 which carries the eight sucker holder assemblies 40 such that they are circumferentially spaced equiangularly from one another. More particularly, as shown in FIG. 6, the previously described holder body 10 is fixed to the lower ends of two parallel rods 88 which are axially slidably supported in the rotary disc 86 through bearings 90. The upper ends of the parallel rods 88 are connected to a connecting member 92 which carries a roller 93 as illustrated in FIG. 4. The roller 93 engages the cam groove 72 in the solid cam 74. The cam groove 72 is so formed that a half revolution of the rotary disc 86 will cause the parallel rods 88 to axially move from the uppermost (fully retracted) position shown at left in FIG. 4 down to the lowermost (fully advanced) position shown at right in the same figure, whereby the sucker holder assembly 40 undergoes one axial reciprocation, that is, one lowering travel and one elevating travel during one full rotation of the rotary disc 86. It is noted that the rotary disc 86 cooperates with a valve plate 91 to constitute a rotary switch valve which is provided in a conduit connecting the previously mentioned joint fitting 38 and the vacuum tank in order to open and close the conduit, i.e., to effect communication between the air passage 30 in the sucker 18 and the vacuum source at appropriate timings during rotation of the rotary disc 86.

There will be described below a device to actuate the sucker 18 received within the holder assembly 40. The sucker 18 whch consists of the first and second members 20 and 22 as described before, is connected to a rod 94 whose lower end is fitted in the first member 20 and fixed to the same by a pin 96 as most clearly shown in FIG. 1. This rod 94 extends upwardly through the rotary disc 86 and the connecting member 92 as shown in FIG. 4, and has at its upper end an engagement member 98. The rod 94 is biased upwardly by a spring 100 disposed between the engagement member 98 and the connecting member 92, so that the sucker 18 connected to the lower end of the rod 94 is biased toward its retracted position. When the holder assembly 40 is located at a work station shown at left in FIG. 4, the engagement member 98 is engageable with an engagement slot 106 in a lever 104 which is pivotably supported on the main frame 70 by means of a shaft 102. The lever 104 is connected to one arm of another lever 110 by a connecting rod 108. The lever 110 is pivotably supported on the main frame 70 by a shaft 112. The other arm of the lever 110 has at its end a roller 114 which is biased by a spring 116 and thereby held in engagement with a cam 118 which is fixed to the drive shaft 82 to which the previously introduced indexing cam 84 is secured. The cam 118 is shaped so that the rotation of the drive shaft 82 causes the lower end of the sucker 18 to protrude a predeterminate distance out of the holder body 10 stopped at the work station shown at left of FIG. 4. The above arrangement constitutes sucker drive means 120 for moving the sucker 18 along the longitudinal centerline thereof between the advanced lowermost position at which an electronic component is sucked by the sucker 18, and the retracted uppermost position which is distant from the advanced position toward the holder body 10 along the sucker centerline.

While there has been described the sucker drive means 120 for moving the sucker 18 to its advanced position when the holder assembly 40 is stopped at the left work station of FIG. 4, the sucker 18 is required to be moved to that advanced position also when the holder assembly 40 is stopped at a work station shown at right in FIG. 4. For this purpose, a sucker drive means 120a is provided. This drive means 120a has an arrangement similar to that of the drive means 120. For convenience, therefore, the same reference numerals followed by letter "a" will be applied to identify corresponding parts, and their detailed description will be omitted herein.

The opposed jaws 44 which have the inward protrusions 50, i.e., the first pair of positioning members of the first positioning unit 42, are opened and closed by a jaw actuating assembly (first positioning drive means) 122. As previously described with reference to FIG. 1, the jaws 44 are biased by the springs 64 toward the spaced-apart positions but the opening movements of the jaws 44 are blocked by the sleeve 54. The jaws 44 are opened when the sleeve 54 is axially retracted against the biasing force of the spring 56. The previously indicated engaging member 68 engageable with the flange 66 to retract the sleeve 54, is fixed at one end to a lower end of a rod 124 which is slidably inserted in a central bore of the rotary shaft 78, as illustrated in FIG. 4. An upper end of this rod 124 is connected to one arm of a lever 128 by a connecting rod 126. The lever 128 is pivotably supported by a shaft 112a, and the other arm of the lever 128 carries a roller 132 which is biased by a spring 134 into engagement with a cam 136 fixed to the drive shaft 82. The cam 136 is adapted so that the rod 124 is elevated once each time the rotary disc 86 is rotated by one eighth revolution and stopped. As shown in FIG. 4, the three engaging members 68 are secured to lower end of the rod 124 such that they are located at different vertical positions and circumferentially spaced by an angle of 90 degrees. Upon lifting movement of the rod 124, the engaging members 68 simultaneously retract or lift the corresponding sleeves 54 of the respective three first positioning units 42 which are stopped at the work stations circumferentially spaced with an equal angular distance of 90 degrees. Thus, the opposed jaws 44 are opened. On the other hand, the lowering movement of the rod 124 and the resultant downward movement of the engaging member 68 will permit the spring 56 to press the sleeve 54 downwardly, thereby causing the opposed jaws 44 to close. Thus, the spring 56 serves as a part of the jaw actuating assembly 120 which includes the engaging member 68, rod 124, connecting rod 126, lever 128, cam 136 and drive shaft 82.

In the present apparatus, the rotary disc 86 is intermittently rotated one eighth revolution, and as a result the holder assembly 40 is intermittently moved a predetermined distance along a circular path. In more detail referring to FIG. 7, the holder assembly 40 picks up an electronic component 138 at work station A from a component transfer unit (not shown), and places the component 138 on the circuit substrate at work station B after the holder assembly 40 has passed work stations C and D where a second positioning unit 140 and an adhesive coating unit 142 are provided. The work stations A, B, C and D are spaced circumferentially on a circle in a plane normal to the centerline of the sucker 18. Although the adhesive coating unit 142 is provided to coat the bottom side of the component 138 with an adhesive for bonding the component to the circuit substrate, this coating unit 142 is not directly concerned with the subject matter of the present invention and therefore the detailed description thereof is omitted. The second positioning unit 140 will be described hereinafter.

Figure 8:
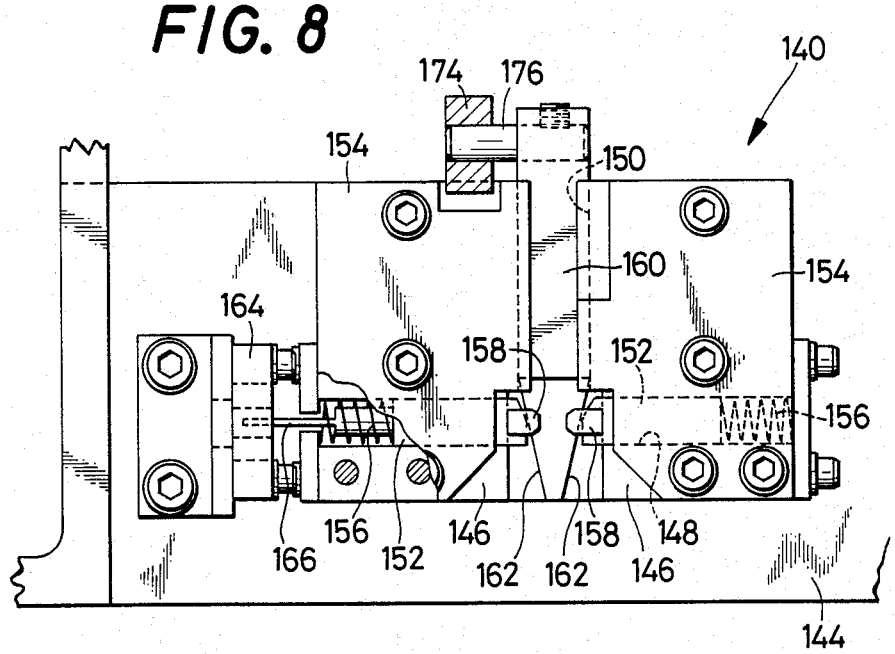
FIGS. 8, 9 and 10 are plan, front and side elevational views, respectively, in enlargement of the second pair of positioning members of FIG. 7.
Figure 9:
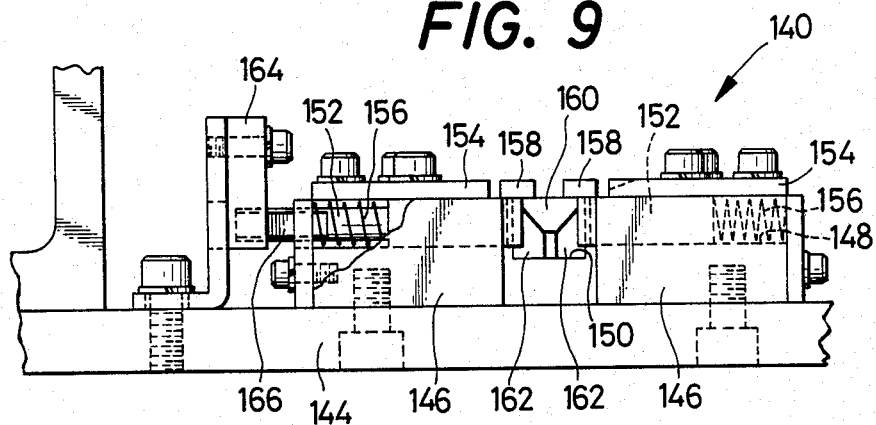
Figure 10:
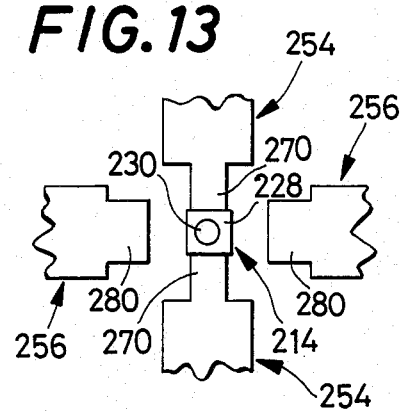

The second positioning unit 140 is secured to the foregoing main frame 70 by means of a bracket 144. To the bracket 144 are fixed blocks 146 designed to serve as a support body on which the second positioning unit 140 is supported, as illustrated in FIGS. 8-10. The blocks 146 have rectangular slots 148 and a rectangular slot 150 perpendicular to the slots 148. In the rectangular slots 148, there are slidably fitted a pair of sliding members 152 whose floating motion is prevented by plates 154. The sliding members 152 are biased by respective springs 156 in opposite directions toward each other. A pair of opposed positioning jaws 158 are secured to the top surfaces of the opposed ends of the sliding members 152. These positioning jaws 158 are provided to serve as a second pair of positioning members. On the other hand, a cam member 160 is slidably received in the rectangular slot 150, and its floating motion is prevented also by the said plates 154. As clearly seen in FIG. 8, the cam member 160 has at its one end a pair of opposed cam surfaces 162 which are tapered symmetrically with respect to the longitudinal centerline of the cam member 160, and the opposed ends of the sliding members 152 are similarly tapered so that an advancing movement of the cam member 160 toward the opposed ends of the sliding members 152 will cause the latter members 152 to move away from each other against the biasing forces of the springs 156. Thus, the opposed positioning jaws 158 are moved away from each other. Conversely, a retracting movement of the cam member 160 in a direction away from the opposed ends of the sliding members 152 will enable the springs 156 to move the sliding members 152 toward each other, thereby causing the positioning jaws 158 to come closer toward each other. The instant second positioning unit 140 is positioned with respect to the holder assembly 40 so that the longitudinal centerline of the sucker 18 on the holder assembly 40 is located on the longitudinal centerline of the cam member 160 when the holder assembly 40 is stopped at the work station C shown in FIG. 7. Further, the positioning jaws 158 are adapted such that, in the above condition, an electronic component sucked on the sucker 18 is located right between the jaws 158. Stated differently, the holder assembly 40 and the second positioning unit 140 are movable relative to each other so that they are temporarily aligned with each other at the work station C. Numeral 164 indicates a sucking failure detector which generates a signal, upon actuation of the second positioning unit 140, if no electronic component is sucked on the end face 28 of the sucker 18 and the sliding members 152 are advanced toward each other more than a predetermined distance. For this purpose, the sliding member 152 adjacent to the detector 164 has a light intercepting piece 166 extending from its rear end opposite to the positioning jaw 158. Normally, this piece 166 intercepts a light which is emitted in the detector 164 from its emitter toward its receiver. In the event of an excessive movement of the light intercepting piece 166 due to absence of a sucked electronic component, the light is received by the receiver and the sucking failure signal is produced from the detector 164.

Next, a drive assembly 170 (second positioning drive means) to actuate the second positioning unit 140 will be described. The drive assembly 170 includes a lever 174 which is pivotally supported on the bracket 144 by a shaft 172, as most clearly shown in FIG. 10. One arm of this lever 174 engages a pin 176 extending from a side surface of the rear end of the previously discussed cam member 160, and the other arm is connected by a connecting rod 178 to a lever 180 shown in FIG. 5. The lever 180 engages a cam 182 secured to the drive shaft 82. With this arrangement, the cam member 160 is advanced and retracted as the drive shaft 82 is rotated. The advancement of the cam member 160 causes the positioning jaws 158 to move away from each other together with the sliding members 152, while the retracting movement of the cam member 160 permits the sliding members 152 to move toward each other with the biasing forces of the springs 156, whereby the positioning jaws 158 are moved toward each other. As indicated above, the shaft 172, lever 174, pin 176, connecting rod 178, lever 180 and cam 182 cooperate with the springs 156 to constitute a major part of the second positioning drive assembly or means 170 for actuating the positioning jaws 158, i.e., the second pair of positioning members to move them toward and away from each other.

While the holding and centering of an electronic component by the apparatus described above will be described below, it is to be understood that the description of such operation will clarify a preferred embodiment of a method of the present invention.

Figure 7:
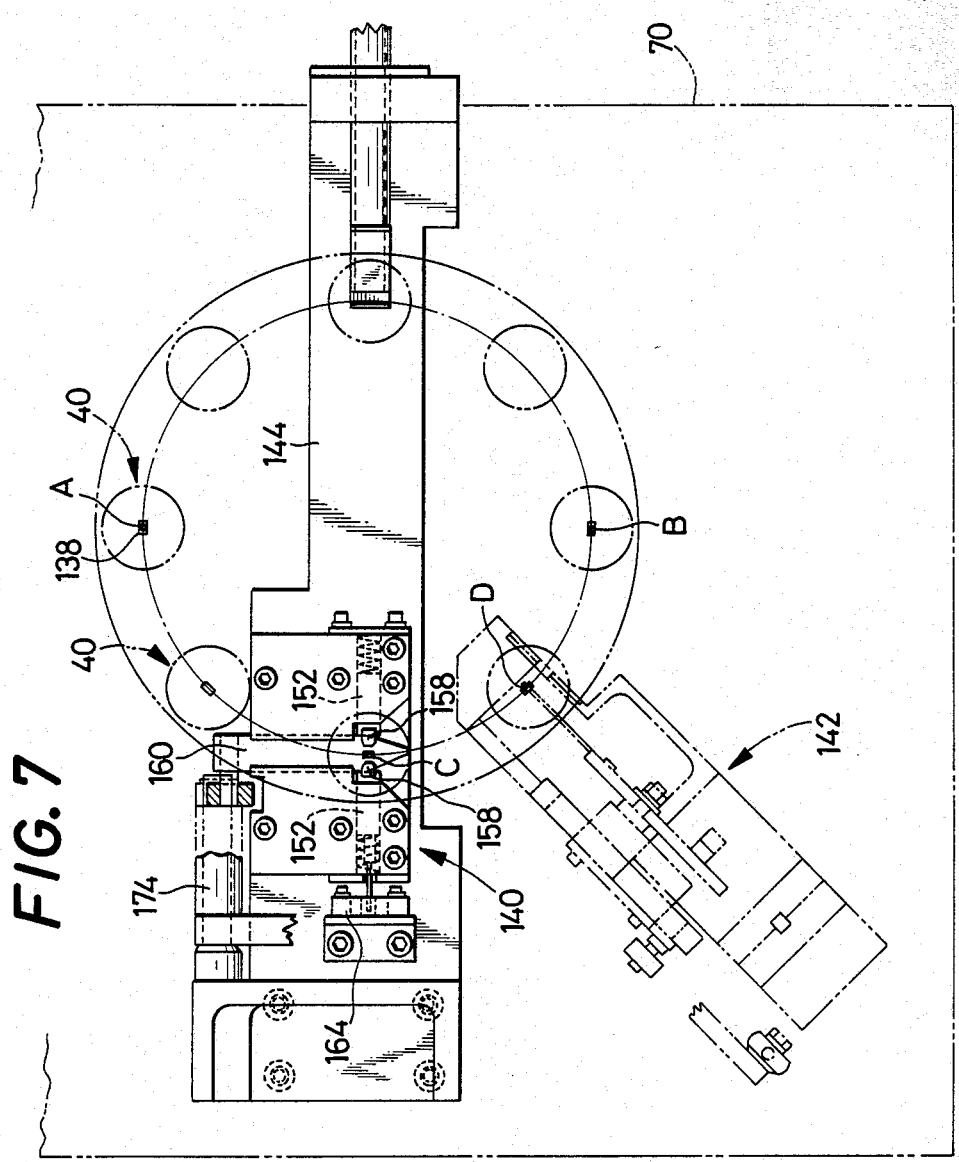
FIG. 7 is a plan view of the device of FIGS. 4 and 5 illustrating the holder assembly of FIGS. 1-3 and a second pair of positioning members used in combination with the first pair of positioning members.

When one of the eight holder assemblies 40 is stopped at the work station A of FIG. 7, the sucker 18 is moved to its advanced position by the sucker drive means 120 to suck the electronic component 138 onto its end face, and returned to its retracted position. The jaws 44 of the first positioning unit 42 are held open while the component 138 is sucked, and closed by the jaw actuating assembly 122 after the sucker 18 has been restored to the retracted position. As a result, the inward protrusions 50 of the jaws 44 finally hold the component 138 on opposite sides thereof in a direction along the length of the component after they have moved toward each other in symmetrical relation with each other with respect to the centerline of the sucker 18. This symmetry of movements of the opposed inward protrusions 50 ensures alignment of the longitudinal center of the sucked component 138 with the centerline of the sucker 18.

As the rotary disc 86 is subsequently rotated intermittently, the holder assembly 40 is moved intermittently along the circular path as shown in FIG. 7 by a predetermined angular distance between one station to the next. When the holder assembly 40 carrying the sucked component 138 has been located at the work station C, the jaw actuating assembly 122 and the second positioning drive means 170 are actuated in the following manner. At first, the opposed jaws 44 are opened by the actuating assembly 122. Then, the opposed positioning jaws 158 of the second positioning unit 140 are moved toward each other in a direction normal to the direction in which the inward protrusions 50 of the jaws 44 are moved, whereby the positioning jaws 158 finally hold the component 138 on the other opposite sides thereof in a direction across the length or along the width of the component. Like the inward protrusions 50 of the first positioning unit, the positioning jaws 158 of the second positioning unit 140 are moved in symmetrical relation with each other with respect to the centerline of the sucker 18, and therefore the component 138 is brought into alignment with the center of the sucker 18 in the direction along the width of the component. Since this centering of the component 138 by the positioning jaws 158 is accomplished while the inward protrusions 50 of the jaws 44 are held open or located away from the component 138, no frictional sliding takes place between the component 138 and the inward protrusions 50. During the centering of the component 138 by the opposed positioning jaws 158, one of the jaws 158 comes into contact with the corresponding side of the component 138 before the other jaw 158 contacts the opposite side, and consequently the component 138 is moved on the end face 28 of the sucker 18. Since this movement is in the direction perpendicular to the centerline of the sucker 18 and to the direction of movements of the jaws 44, there is no possibility that the longitudinal alignment of the component 138 established by the jaws 44 at the work station A is lost during the movement of the component by the positioning jaws 158 at the work station C. Immediately after the component 138 has been centered in its width direction, the positioning jaws 158 are moved away from each other and from the component 138. Thus, the electronic component 138 is centered into alignment with the center of the sucker 18, i.e., held at the exact position on the holder assembly 40. Subsequently, the jaw actuating assembly 122 is again actuated to close the jaws 44 of the first positioning unit 42, with a result of the inward protrusions 50 gripping the component 138 on the opposite sides in its longitudinal direction.

Upon completion of the above stated steps of operations at the work station C, the holder assembly 40 is moved to the work station D at which a coating of adhesive material is applied to the bottom side of the component 138. After the application of the adhesive coating to the component at the work station D, the holder assembly 40 is further moved to the work station B at which the sucker drive means 120a is operated to move the sucker 18 to its advanced position. With advancing movement of the sucker 18, the component 138 sucked on the sucker 18 is pressed, with a resilient force of the spring 24 shown in FIG. 1, onto the circuit substrate which has been previously positioned for placement of that component 138 at the predetermined position, whereby the component 138 is bonded at the bottom to the substrate.

As discussed above, the suction and the longitudinal centering of the component 138 are conducted at the work station A, the transverse centering of the same is achieved at the work station C, the adhesive coating to the same at the work station D, and its bonding to the circuit substrate at the work station B. In other words, the necessary steps of operations on one electronic component are carried out at different work stations. These plural steps to be performed at the separate stations are simultaneously conducted on plural electronic components on different placing heads, i.e., the holder assemblies. Therefore, the placement of the components 138 on the circuit substrate is achieved with high efficiency.

It is apparent from the foregoing description of the present embodiment of the invention that the electronic component 138 is first centered in its longitudinal direction (first direction) through the closing movements of the inward protrusions 50 (first pair of positioning members) of the first positioning unit 42 toward opposite sides of the component, which closing movements are produced by the jaw actuating assembly 122 (first positioning drive means). Then, the first pair of positioning members 50 are moved away from the component 138, and the component is centered in its width direction (second direction) through the closing movements of the positioning jaws 158 (second pair of positioning members) of the second positioning unit 140 toward the other opposite sides of the component, which closing movements are produced by the second positioning drive means 170. In this embodiment, the drive means for actuating the first and second positioning units 42 and 140 is constituted by the first positioning drive means (jaw actuating assembly) 122 and the second positioning drive means 170. With this driving arrangement, the first pair of positioning members (inward protrusions) 50 are held away from the component 138 when the second pair of positioning members (positioning jaws) 158 are moved to close on the opposite sides of the component 138 in its width direction. For this reason, the first pair of positioning members movable in the first direction will not prevent the second pair of positioning members from centering the component 138 in the second direction, nor will they scratch the side surfaces of the compoent 138. Further, the wear of the inward protrusions 50 due to otherwise possible frictional sliding thereof is prevented and therefore the life of the jaws 44 is remarkably prolonged.

Figure 12:
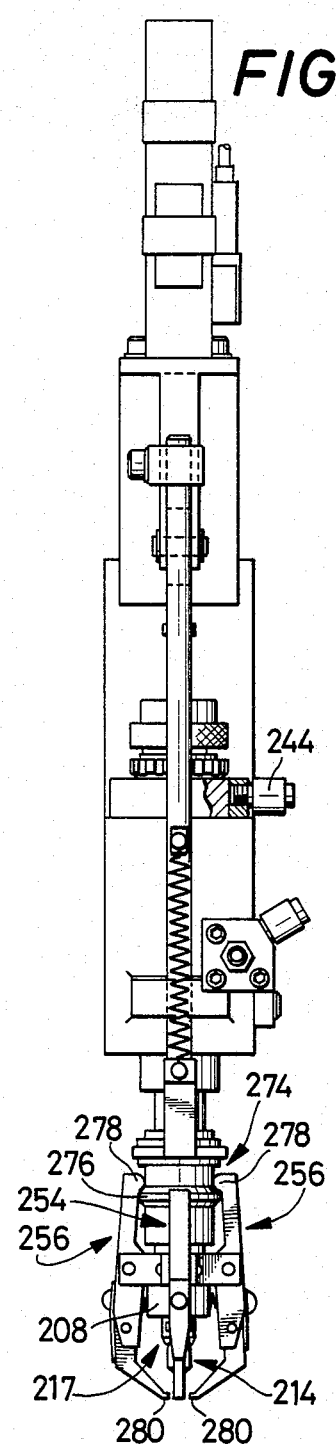
FIG. 12 is a side elevation of the apparatus of FIG. 11.
Figure 11:
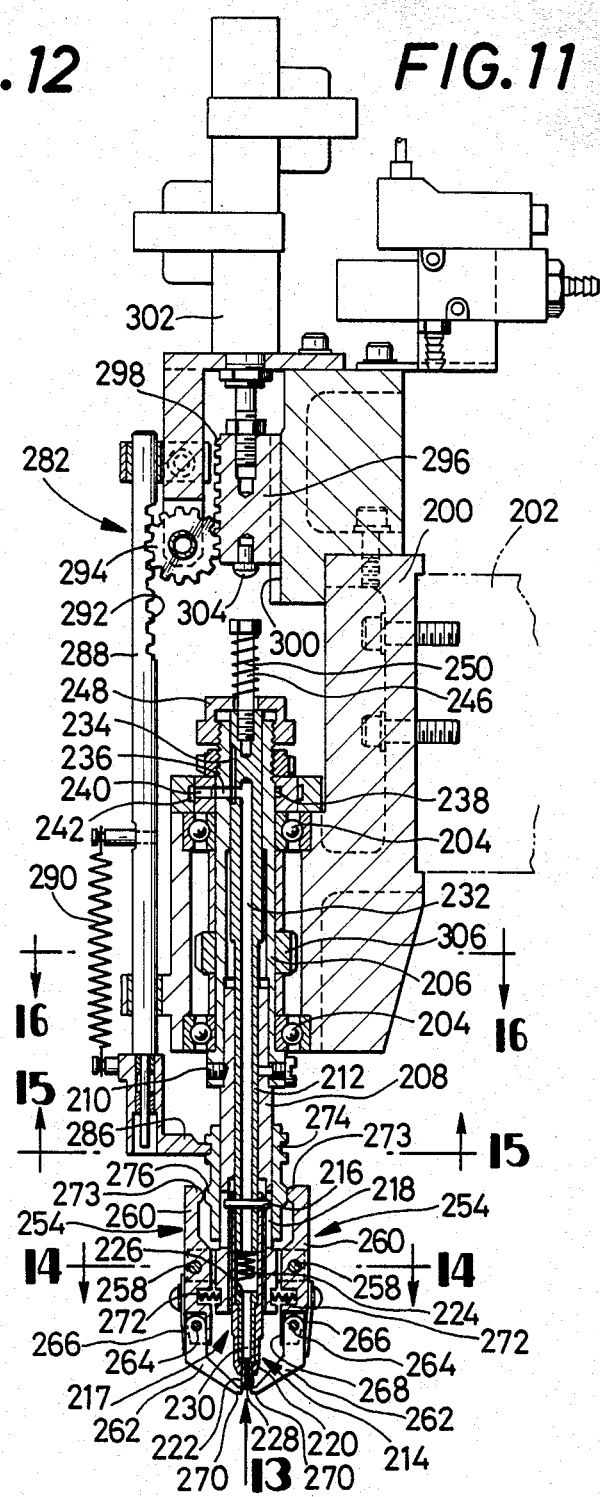
FIG. 11 is a front elevation in cross section of a second embodiment of an electronic component holding and centering apparatus of the invention.

Second Embodiment:

Referring next to FIGS. 11 and 12, there is shown a second embodiment of an apparatus of the present invention for holding and centering an electronic component. This apparatus is used with a device for placing on a circuit substrate electronic components in the form of flat-package IC chips, mini-package IC chips, etc. While, in the previous first embodiment, the positions on the circuit substrate at which the electronic components are placed are selected by moving the substrate relative to the holder assembly 40 at the work station B, a holder assembly of this embodiment carrying an electronic component is moved relative to a stationary circuit substrate to place and bond the component at the predetermined positions on the substrate. The holder assembly is operated while it is held upright, but it is shown in FIGS. 11 and 12, for convenience of illustration, so as to extend horizontally. In operation, the left-hand side end of the apparatus as shown in the figures is located on the upper side and the right-hand side end of the figures is located on the lower side.

In FIG. 11, numeral 200 designates a bracket secured to a movable member 202 which is movable along X and Y axes normal to each other. The bracket 200 supports a hollow rotary shaft 206 rotatably through bearings 204. In one end of this rotary shaft 206 is fitted one end of a holder body 208 of tubular structure which is secured to the rotary shaft 206 with setscrews 210. A rod 212 extends slidably through the holder body 208 and the hollow rotary shaft 206 axially thereof. A sucker 214 which engages the outer surface of the lower end of the rod 212, is fixed to the same with a pin 216. The sucker 214 cooperates with the holder body 208 to constitute a holder assembly 217. The pin 216 projects at opposite ends thereof from the outer surface of the sucker 214. The projecting ends of the pin 216 are located within elongate holes 218 formed axially in the holder body 208. The pin 216 and the holes 218 prevent the rod 212 and the sucker 214 from rotating relative to the holder body 208 but permit the former 212, 214 to axially move relative to the latter 208. The sucker 214 consists of a first member 220 and a second member 222. The first member 220 is a tubular member which has a stepped through-bore formed of a large diameter hole and a small diameter hole. In the first member 220 is axially slidably fitted the second member 222 which has a tip of square cross section as indicated in enlargement in FIG. 13. This tip is normally protruded a given distance out of a rectangular hole in the first member 220. The sucker 214 has an air sucking passage 230 which is open at the center of an end face 228 of the second member 222. This air passage 230 is kept in communication with a joint fitting 244 shown in FIG. 12 through an axial passage 232 in the rod 212, an axial groove 234, an communication hole 236, an annular groove 238, another communication hole 240 and another annular groove 242. The rod 212 has a bolt 246 extending from the upper end thereof through a central hole of a cap 248 which is threaded to the upper end of the rotary shaft 206. A spring 250 is disposed between a head of the bolt 246 and the upper surface of the cap 246 in order to bias the sucker 214 toward its retracted position through the rod 212. The retracted position of the sucker 214 is determined by abutment of the upper end of the rod 212 against the lower surface of the cap 248.

Figure 14:
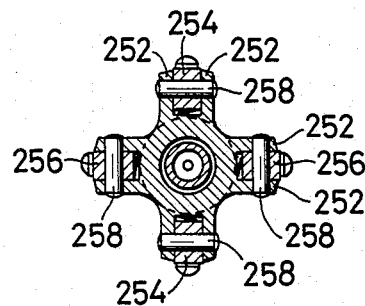
FIGS. 14, 15 and 16 are cross sectional views taken in lines 14—14, 15—15 and 16—16 of FIG. 11, respectively.

The lower end of the holder body 208 is provided with four pairs of support projections 252 which are spaced circumferentially with an angular distance of 90 degrees between adjacent pairs, as shown in FIG. 14. On these pairs of projections 252, there are supported a first and a second pair of opposed jaw units 254, 256 which are pivotable at their intermediate portions about respective pins 258. Each of the first pair of jaw units 254, as shown in FIG. 11, includes a first member 260, and a second member 262 which is pivotably connected by a pin 264 to the first member 260 and has at its free end an inward projection 270. The connected end of the second member 262 is urged by a leaf spring 266 against a stopper 268 of the first member 260. In this arrangement, the second member 262 is adapted to pivot normally as if it were an integral part of the second member 260, but the second member 262 is pivoted against the resilient force of the leaf spring 266 about the pin 264 relative to the first member 260 when an outward force, which acts on the inward projection 270 in a direction away from the center of the sucker 214, exceeds a given value. This pivotal connection between the first and second members 260 and 262 enables the apparatus to hold and center various kinds of electronic components of varying sizes. The first pair of opposed jaw units 254 are biased, by springs 272 disposed between the holder body 208 and the jaw units 254, in a direction that causes the inward projections 270 to move away from each other.

While the first pair of jaw units 254 have been described in detail, the second pair of jaw units 256 have the same construction as the first pair 254 except an only difference that a length of the first member extending from the pin 258 away from the second member is longer a suitable distance than that of the first member 260 of the first pair of jaw units 254. More specifically stated, a distance between the pin 258 and an abutment 278 at the upper end of the jaw unit 256 is longer than a distance between the pin 258 and an abutment 273 at the upper end of the first member 260 of the jaw unit 254.

Figure 13:
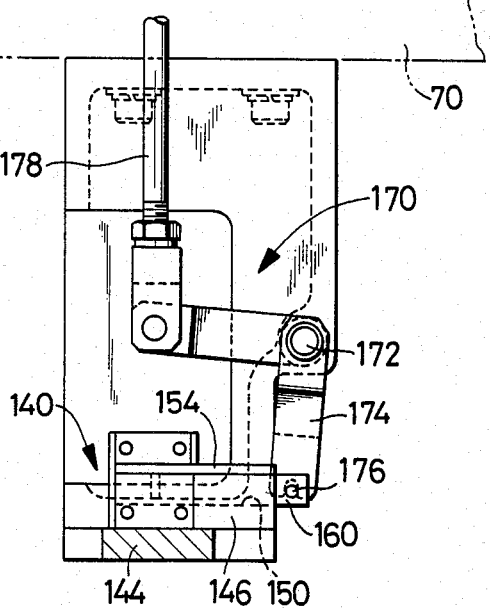
FIG. 13 is a view taken in the direction of arrow 13 of FIG. 11.

A cam member 274 of cylindrical configuration is slidably fitted on the outer surface of the holder body 208. The cam member 274 has on its outer peripheral surface an annular protrusion 276 which is engageable with the abutments 273 and 278 of the first and second pair of jaw units. Since the distance between the pin 258 and the abutment 273, 278 is different between the first and second pairs of jaw units 254, 256 as stated above, the abutments 278 of the second pair of jaw units 256 are out of alignment of the annular protrusion 276 axially of the cam member 274 when the abutments 273 of the first pair of jaw units 254 are in abutting contact with the annular protrusion 276. In other words, when the first pair of jaw units 254 are closed at their inward protrusions 270 (when the first pair of positioning members are place at their fully closed positions), the second pair of jaw units 256 are open at their inward protrusions 280, i.e., the second pair of positioning members are placed at their spaced-apart positions. When the inward protrusions 270 are at their fully closed positions, they grip the tip of the sucker 214 in a sandwich fashion as shown in FIG. 13. It is noted in this connection that the width of the inward protrusions 270 is slightly smaller than that of the sucker tip. On the contrary, the width of the inward protrusions 280 of the second pair of jaw units 256 is greater than that of the sucker tip.

Figure 15:
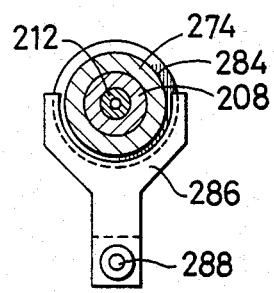

The description now refers to a drive assembly to actuate the first and second pairs of jaw units 254 and 256, i.e, positioning drive means 282 for moving each of the first and second pairs of positioning members toward and away from each other so as to center an electronic component sucked on the sucker 214. The drive means 282 which includes the said cam member 274 comprises a yoke member 286 which engages an annular groove 284 formed in the cam member 274 as illustrated in FIG. 15. This yoke member 286 is disposed in parallel to the centerline of the holder body 208 and slidably fitted in a small-diameter end portion of a rod 288 which is axially slidably supported on the bracket 200. A spring 290 is disposed between the rod 288 and the yoke member 286 to bias the yoke member 286 so that the yoke member is normally held in abutment on the shoulder of the rod 288. The rod 288 is formed with a rack 292 which engages a pinion 294 rotatably supported on the bracket 200. The pinion 294 also engages a rack 298 formed integrally on a slider 296 which is movable along the centerline of the holder body 208 by an air cylinder 302 fixed to the bracket 200 while the slider 296 is guided by a guide groove 300 formed in the bracket 200. As a result, the pinion 294 is rotated, and the cam member 274 is slid on the holder body 208 through the rod 288 and yoke member 286, whereby the first and second pairs of jaw units 254 and 256 are opened and closed in a pivoting manner. The positioning drive means 282 is constructed as described above. It is noted that the springs 272 constitute a part of the drive means 282, as in the previous embodiment.

The slider 296 and the air cylinder 302 act also as drive means for actuating the sucker 214. In more detail, the slider has a fixed abutting member 304 which comes into abutment on the head of the previously indicated bolt 246 after the slider 296 has moved toward the holder body 208 a distance necessary to open both first and second pairs of jaw units 254, 256. A further movement of the slider 296 will result in the bolt 246 being moved against the resilient force of the spring 250, whereby the sucker 214 is moved from its retracted position in FIG. 11 down to the advanced position.

Figure 16:
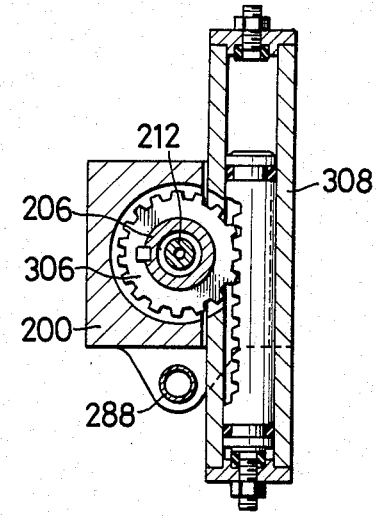

The above discussed holder assembly, and the first and second pairs of jaw units 254, 256 are adapted to be rotated about the centerline of the sucker 214. More specifically, a pinion 306 is fixed to the rotary shaft 206 and this pinion 306 is rotated 90 degrees by a rack-cylinder assembly 308 shown in FIG. 16.

The operation of the holding and centering apparatus according to the present embodiment will be described. It is understood that this description will explain about a second embodiment of the present method.

Upon movement of the slider 296 by the air cylinder 302 toward the holder body 208, the rod 288 is moved in the opposite direction through the pinion 294 which reverses the movement of the slider 296, and the cam member 274 is retracted upwardly. In consequence, the abutments 273 of the first pair of jaw units 254 are disengaged from the annular protrusion 276 and the jaw units 254 are opened by the springs 272. In the meantime, the abutments 278 of the second pair of jaw units 256 which have been located on one side of the annular protrusion 276, are brought into abutting contact with the annular protrusion 276 and then moved to the other side of the protrusion 276, i.e., disengaged from the protrusion 276. Thus, the second pair of jaw units 256 are first closed and then opened again.

Subsequently, a further movement of the slider 296 toward the holder body 208 will cause the abutting member 304 to abut on the bolt 246 and thereby advance the sucker 214 through the rod 212. During this movement of the slider 296, the rod 288 is further retracted. However, the cam member 274 and the yoke member 286 are not moved after the cam member 274 abuts on the lower end of the rotary shaft 206. The movement of the rod 288 after the abutment of the cam member 274 on the shaft 206 is permitted through expansion of the spring 290. The end face 228 of the advanced sucker 214 is brought into contact with an electronic component held in a component transfer assembly, and the component is sucked by the sucker 214. It is noted in this connection that an excessive advancing movement of the rod 212 is absorbed by the spring 224 whereby the sucker 214 and the component to be sucked are protected from an excessive stress.

A subsequent retracting movement of the slider 296 allows the sucker 214 to return to its retracted position. However, the cam member 274 remains stopped in abutment on the end of the rotary shaft 208. When the slider 296 is further retracted after the sucker 214 has been fully retracted, the shoulder face of the rod 288 comes into abutment on the yoke member 286. A further retracting movement of the slider 296 will advance (lower) the yoke member 286 and consequently the cam member 274, with a result that the annular protrusion 276 comes into engagement with the abutments 278 of the second pair of jaw units 256. Therefore, the jaw units 256 are pivoted so that their inward projections 280 are moved toward each other and close an opposite sides of the electronic component sucked on the sucker 214. Since the jaw units 256 and the cam member 274 are constructed symmetrically with respect to the centerline of the sucker 214, the inward projections 280 are moved in symmetrical relation with each other with respect to the centerline of the sucker 214 whereby the center of the electronic component is brought into alignment with the center of the sucker 214. Further pivoting movements of the jaw units 256 in the closing direction after the inward projections 280 have closed on the component, are absorbed by elastic deflection of the leaf springs 266.

Upon further retracting movement of the slider 296 after the closure of the second pair of jaw units 256 on the component, the abutments 278 of the jaw units 256 are disengaged from the annular protrusion 276 and the jaw units 256 are opened again. During this opening of the jaw units 256, the abutments 273 of the first pair of jaw units 254 come into abutting contact with the annular protrusion 276 and therefore the jaw units 254 are closed. As a result, the inward projections 270 hold the component on the other opposite sides thereof in a direction which is normal to the direction in which the component is held by the inward projections 280. Thus, the component is centered into alignment with the sucker 214 in the former direction. Since this centering operation of the first pair of jaw units 254 is effected after the inward projections 280 of the second pair of jaw units 256 have moved away from the electronic component, there is developed no frictional force between the electronic component and the inward projections 280 while the component is centered by the inward projections 270.

With the above stated steps of operations, the electronic component is held on the sucker 214 with the center of the former in alignment with that of the sucker 214. In this condition, the holder assembly 217 is moved to be positioned at an adhesive coating unit and the bottom side of the component is coated with an adhesive. The holder assembly 217 is then positioned relative to a fixed circuit substrate so that the component is aligned with a predetermined position on the substrate on which it is placed. Then, the air cylinder 302 is again activated to open the first and second pairs of jaw units 254, 256 and advance the sucker 214 whereby the component sucked on the sucker 214 is pressed onto and bonded to the circuit substrate. If necessary at this time, the holder assembly 217 and the first and second pairs of jaw units 254, 256 may be rotated by 90 degrees to change the position of the component in the plane of the substrate.

Modified Embodiments

While the two preferred embodiments of the invention have been described, it is obvious that the invention may be otherwise embodied.

For example, while the first positioning unit 42 of the first embodiment is carried by the holder body 10, the positioning unit 42 may be provided, like the second positioning unit 140, separately from the holder body 10 and located at a work station spaced from the work station at which the second positioning unit 140 is provided.

Although the holding and centering apparatus according to the present invention is most effectively employed in conjunction with a device for placing electronic components on a circuit substrate to produce a printed circuit board, the present apparatus is not limited to such application but may be equally used for other purposes which require holding of electronic components with precise positioning thereof.

It is to be understood that the holder assembly, positioning units, drive assemblies thereof and other parts of the present apparatus may of course be embodied in a variety of modified or improved forms within the scope of the appended claims.

What is claimed is:

1. A method for holding and centering an electronic component, comprising the steps of:
    (a) holding an electronic component through suction on a sucker having an air sucking passage open at an end face thereof;
    (b) moving a first pair of positioning members toward each other in a first direction substantially normal to a longitudinal centerline of said sucker, in symmetrical relation with each other with respect to said centerline, so as to hold said electronic component sucked by said sucker, on opposite sides thereof, and thereby pushing said electronic component into alignment with said centerline of said sucker in said first direction while moving the electronic component along said end face;
    (c) moving said first pair of positioning members away from said electronic component after the component has been centered in said first direction; and
    (d) moving a second pair of positioning members toward each other in a second direction substantially normal to said centerline of the sucker and said first direction, in symmetrical relation with each other with respect to said centerline, so as to hold said electronic component on the other opposite sides thereof, and thereby pushing said electronic component into alignment with said centerline of the sucker in said second direction.

2. A method as recited in claim 1, wherein the movements of said first pair of positioning members toward each other are effected at a first position, and the movements of the same away from each other are effected after the same have moved to a second position which is spaced from said first position circumferentially of a circle in a plane normal to said centerline of said sucker, the movements of said second pair of positioning members toward each other are effected at said second position.

3. A method as recited in claim 1, wherein the movement of said first and second pairs of positioning members are effected while they are supported on a single holder body.

4. An apparatus for holding and centering an electronic component, comprising:
    (a) a holder assembly including a holder body, and a sucker supported in engagement with said holder body for longitudinal movement relative to the same, said sucker having an air sucking passage open at an end face thereof for holding through suction said electronic component on said end face;
    (b) sucker drive means for moving said sucker along a longitudinal centerline thereof between an advanced position at which said electronic component is sucked by said sucker, and a retracted position which is distant from said advanced position toward said holder body along said centerline;
    (c) a first positioning unit including a first pair of positioning members which are supported by said holder body and movable from spaced-apart positions thereof toward each othr in a first direction substantially normal to said centerline of said sucker, in symmetrical relation with each other with respect to said centerline, said first pair of positioning members holding said electronic component on opposite sides thereof while the component is sucked by said sucker at said retracted position, and thereby pushing said electronic component into alignment with said centerline of the sucker in said first direction;
    (d) a second positioning unit including a support body which is separate from said holder body, said support body and said holder being movable relative to each other for temporary alignment with each other, said second positioning unit further including a second pair of positioning members which are supported by said support body and movable, upon said temporary alignment of said holder body with said support body, from spaced-apart positions thereof toward each other in a second direction substantially normal to said centerline of said sucker and said first direction, in symmetrical relation with each other with respect to said centerline, said second pair of positioning members holding said electronic component on the other opposite sides thereof, and thereby pushing said electronic component into alignment with said centerline of the sucker in said second direction; and
    (e) positioning drive means associated with said first and second positioning units for moving said first pair of positioning members toward each other at one timing while said sucker is placed in said retracted position, and for moving said second pair of positioning members toward each other at another timing while said temporary alignment is established between said holder body and said support body, said drive means actuating each one of said first and second pairs of positioning members at least once while the other pair of positioning members are held in said spaced-apart positions.

5. An apparatus as recited in claim 4, wherein said holder body is moved from a first position distant from said support body, to a second position at which said holder body is aligned with said support body, the movement of said holder body to said second position including a movement in a plane normal to said centerline of the sucker, said positioning drive means moving said first pair of positioning members toward each other to center said electronic component in said first direction while said holder body is held in said first position, said positioning drive means moving said first pair of positioning members away from each other toward said spaced-apart positions while said holder body is held in said second position, and subsequently moving said second pair of positioning members toward each other to center said electronic component in said second direction.

6. An apparatus as recited in claim 5, wherein said first and second positions are spaced from each other circumferentially of a circle in said plane.

7. An apparatus as recited in claim 5, wherein said first positioning unit comprises pivotable means supported on said holder body pivotably about axes normal to said centerline of said sucker and carrying, at end portions thereof remote from said axes, said first pair of positioning members such that the same members are movable in said first direction.

8. An apparatus as recited in claim 7, wherein said pivotable means comprises a pair of opposed planar jaws having integral inward protrusions which serve as said first pair of positioning members, said jaws each having a tapered cam surface engaging a sleeve which is supported on said holder body slidably movably along said centerline of the sucker, a movement of said sleeve toward said integral inward protrusions of said jaws causing said first pair of positioning members to move each other.

9. An apparatus as recited in claim 5, wherein said second pair of positioning members are movable toward and away from each other along a straight line on said support body, and biased toward each other by resilient means, said second positioning unit further including a cam member which is inserted between and movable relative to said second pair of positioning members to move the same away from each other against the resilient force of said resilient means.

10. An apparatus as recited in claim 9, wherein each of said second pair of positioning members comprises a sliding member slidable on said support body and a positioning jaw secured to one end of said sliding member, said cam member having a pair of opposed symmetrically tapered cam surfaces engaging the sliding members at said one end thereof, a movement of said cam member perpendicular to the movement of the sliding members causing the positioning jaws to move away from each other.

11. An apparatus for holding and centering an electronic component, comprising:
(a) a holder body;
(b) a sucker supported in engagement with said holder body for longitudinal movement relative to the same, and having an air sucking passage open at an end face thereof for holding through suction said electronic component on said end face;
(c) sucker drive means for moving said sucker along a longitudinal centerline thereof between an advanced position at which said electronic component is sucked by said sucker, and a retracted position which is distant from said advanced position toward said holder body along said centerline;
(d) a first and a second pair of positioning members disposed on said holder body and movable respectively in a first and a second direction substantially normal to said centerline of said sucker, said first and second directions being substantially normal to each other, said positioning members in each of said first and second pairs being movable from spaced-apart positions thereof toward each other in a respective one of said first and second directions in symmetrical relation with each other with respect to said centerline so as to hold said electronic compoent on opposite sides thereof while the component is sucked by said sucker, thereby centering said electronic component into alignment with said centerline of said sucker in said first and second directions; and
(e) positioning drive means for moving each one of said first and second pairs of positioning members at least once while the other pair of positioning members are held in said spaced-apart positions.

12. An apparatus as recited in claim 11, wherein said positioning drive means comprises a cam member which is supported by said holder body movably along said centerline of said sucker so as to move said positioning members in each of said first and second pairs toward and away from each other.

13. An apparatus as recited in claim 12, wherein said first and second pairs of positioning members comprise opposed end portions of a first and a second pivotable means, respectively, each supported on said holder body, each of said first and second pivotable means being engageable with said cam member and pivotable about pivoting axes normal to said centerline of said sucker during movement of said cam member such that said end portions are movable in a respective one of said first and second directions.

14. An apparatus as recited in claim 12, wherein said holder body comprises a tubular portion, said cam member comprising a cylindrical portion slidably engaging an outer peripheral surface of said tubular portion and having on an outer peripheral surface thereof an annular protrusion which is engageable with said first and second pivotable means to pivot the same means at different timings.

15. An apparatus as recited in claim 14, wherein said first and second pivotable means respectively comprises a first and a second pair of opposed jaw units pivotable about said pivoting axes, each of said jaw units including a first member engageable with said annular protrusion of said cam member and a second member pivotably connected to said first member and having an inward projection at one end thereof adjacent to said end face of said sucker, said first and second pairs of jaw units are biased such that the inward projections are moved away from said centerline of the sucker.

16. An apparatus as recited in claim 15, wherein the pivotal connection of said first and second members of said jaw unit is provided with a leaf spring for permitting said first and second members to normally pivot integrally about said pivoting axes and for permitting said second member to pivot relative to said first member about another axis parallel to said pivoting axes when a force is exerted on said inward projection thereof.

17. An apparatus as recited in claim 16, wherein each of said first members of the jaw units has an abutment at an end portion thereof remote from the pivoting axis thereof, said abutment engaging said annular protrusion of the cam member, a distance of said abutment of the first pair of jaw units to said pivoting axes is different from that of the abutment of the second pair of jaw units.

18. An apparatus as recited in claim 12, wherein said positioning drive means further comprises an actuator which is movable relative to said holder body along said centerline of said sucker and operatively connected to said cam member.

19. An apparatus as recited in claim 18, wherein said sucker drive means comprises a rod slidably extending through said holder body and connected at one end thereof to an end of said sucker remote from said end face, said actuator being abuttable on the other end of said rod.

20. An apparatus as recited in claim 19, wherein said positioning drive means further comprises a rack-and-pinion mechanism connected to said actuator and cam member for movements of said actuator and said cam member in opposite directions along said centerline of said sucker.

* * * * *